US012809583B2

(12) United States Patent
Su et al.

(10) Patent No.: US 12,809,583 B2
(45) Date of Patent: Nov. 24, 2026

(54) CONFIGURABLE COMPUTING UNIT WITHIN MEMORY

(71) Applicant: Industrial Technology Research Institute, Hsinchu (TW)

(72) Inventors: Jian-Wei Su, Hsinchu City (TW); Chih-Sheng Lin, Tainan City (TW); Peng-I Mei, Hualien County (TW); Sih-Han Li, New Taipei City (TW); Shyh-Shyuan Sheu, Hsinchu County (TW); Jheng Yang Dai, Hsinchu City (TW)

(73) Assignee: Industrial Technology Research Institute, Hsinchu (TW)

( * ) Notice: Subject to any disclaimer, the term of this patent is extended or adjusted under 35 U.S.C. 154(b) by 1247 days.

(21) Appl. No.: 17/679,090

(22) Filed: Feb. 24, 2022

(65) Prior Publication Data

US 2022/0413801 A1 Dec. 29, 2022

Related U.S. Application Data

(60) Provisional application No. 63/215,992, filed on Jun. 29, 2021.

(30) Foreign Application Priority Data

Oct. 28, 2021 (TW) ................................ 110140162

(51) Int. Cl.
*G06F 7/544* (2006.01)
*G11C 7/10* (2006.01)
*G11C 11/419* (2006.01)

(52) U.S. Cl.
CPC .......... *G06F 7/5443* (2013.01); *G11C 7/1006* (2013.01); *G11C 11/419* (2013.01); *Y02D 10/00* (2018.01)

(58) Field of Classification Search
CPC ....... G06F 7/23; G06F 7/5443; G11C 11/412; G11C 7/1006; G11C 11/419; G11C 14/0054
See application file for complete search history.

(56) References Cited

U.S. PATENT DOCUMENTS 8,693,237 B2 4/2014 Jou et al.
8,873,279 B2 10/2014 Houston
(Continued)

FOREIGN PATENT DOCUMENTS

CN 108806604 11/2018
CN 110058839 7/2019
(Continued)

OTHER PUBLICATIONS

Nagalingam Rajeswaran et al., "Ultra low voltage and low power Static Random Access Memory design using average 6.5T technique", Leonardo Electronic Journal of Practices and Technologies, Issue 27, Jul.-Dec. 2015, pp. 138-154.
(Continued)

*Primary Examiner* — Emily E Larocque
*Assistant Examiner* — Jerome Anthony Klosterman, II
(74) *Attorney, Agent, or Firm* — JCIPRNET

(57) ABSTRACT

A configurable computing unit within memory including a first input transistor, a first weight transistor, a first resistor, a second input transistor, a second weight transistor, and a second resistor is provided. The first input transistor, the first weight transistor, and the first resistor are coupled in series between a first readout bit line and a common signal line. The first input transistor is coupled to a first input bit line, and the first weight transistor receives a first weight bit. The second input transistor, the second weight transistor, and the second resistor are coupled in series between the first readout bit line and the common signal line. The second
(Continued)

input transistor is coupled to a second input bit line, and the second weight transistor receives the second weight bit.

16 Claims, 8 Drawing Sheets

(56) References Cited

U.S. PATENT DOCUMENTS

| | | | | |
|---|---|---|---|---|
| 9,697,888 | B1 | 7/2017 | Moharir | |
| 10,636,481 | B1 | 4/2020 | Chang et al. | |
| 10,748,603 | B2 | 8/2020 | Sumbul et al. | |
| 10,877,752 | B2 | 12/2020 | Chen et al. | |
| 10,909,449 | B2 | 2/2021 | Obradovic et al. | |
| 2007/0210853 | A1* | 9/2007 | Maejima | G11C 5/145 327/536 |
| 2013/0003443 | A1 | 1/2013 | Houston | |
| 2018/0300618 | A1 | 10/2018 | Obradovic et al. | |
| 2019/0385049 | A1 | 12/2019 | Yang et al. | |
| 2020/0372330 | A1 | 11/2020 | Chang et al. | |
| 2021/0125663 | A1* | 4/2021 | Chang | G06N 3/045 |
| 2021/0216846 | A1* | 7/2021 | Chang | G06F 7/5443 |
| 2022/0114427 | A1* | 4/2022 | Jung | G11C 11/1655 |
| 2022/0246212 | A1* | 8/2022 | Lue | G11C 11/54 |

FOREIGN PATENT DOCUMENTS

| | | |
|---|---|---|
| CN | 111353122 | 6/2020 |
| CN | 111433851 | 7/2020 |
| CN | 111611529 | 9/2020 |
| CN | 111640462 | 9/2020 |
| CN | 111695683 | 9/2020 |
| EP | 2600349 | 6/2013 |
| EP | 3742351 | 11/2020 |
| TW | 202034156 | 9/2020 |
| TW | I706414 | 10/2020 |

OTHER PUBLICATIONS

Akhilesh Jaiswal et al., "8T SRAM Cell as a Multibit Dot-Product Engine for Beyond Von Neumann Computing", IEEE Transactions on Very Large Scale Integration (VLSI) Systems, vol. 27, No. 11, Nov. 2019, pp. 2556-2567.

Amogh Agrawal et al., "X-SRAM: Enabling In-Memory Boolean Computations in CMOS Static Random Access Memories", IEEE Transactions on Circuits and Systems-I: Regular Papers, vol. 65, No. 12, Dec. 2018, pp. 4219-4232.

Xin Si et al., "24.5 A Twin-8T SRAM Computation-In-Memory Macro for Multiple-Bit CNN-Based Machine Learning", 2019 IEEE International Solid-State Circuits Conference (ISSCC), Feb. 2019, pp. 396-398.

Bo Wang et al., "A 0.2V 16Kb 9T SRAM with Bitline Leakage Equalization and CAM-assisted Write Performance Boosting for Improving Energy Efficiency", IEEE Asian Solid-State Circuits Conference, Nov. 12-14, 2012, pp. 73-76.

Kang; Yaopeng et al., "Design of SRAM with CNFET based on ternary literal circuit", Microelectronic Technology, Mar. 6, 2018, with English abstract, pp. 7-10, vol. 44, No. 3.

Liu; He et al., "Training and Software Simulation for ReRAM-Based LSTM Neural Network Acceleration", Journal of Computer Research and Development, Jul. 16, 2019, with English abstract, pp. 1182-1191, vol. 56, No. 6.

* cited by examiner

CONFIGURABLE COMPUTING UNIT WITHIN MEMORY

CROSS-REFERENCE TO RELATED APPLICATION

This application claims the priority benefit of U.S. provisional application Ser. No. 63/215,992, filed on Jun. 29, 2021, and Taiwan application serial no. 110140162, filed on Oct. 28, 2021. The entirety of each of the above-mentioned patent applications is hereby incorporated by reference herein and made a part of this specification.

TECHNICAL FIELD

The disclosure relates to a computing unit, and more particularly, to a configurable computing unit within memory.

BACKGROUND

Computing in memory (CIM) technology is regarded as one of the effective technologies to solve the memory wall, which uses computing in memory to reduce the number of data migrations, and may greatly increase the computing speed to hundreds or even thousands of times that of the conventional architecture. Nowadays, large artificial intelligence (AI) networks (such as the deep neural network (DNN)) consume a large part of the energy in the data migration, but the computing in memory technology may also greatly reduce the energy wasted due to data migration, which may be said to be a potential future artificial intelligence technology that both increases computing power and reduces power consumption.

The potential of computing in memory has led many manufacturers and research units to invest in and publish many novel technologies. Most of them change the computing unit to an analog type, and determine the analog accumulated value of the number of opened cells as a result of performing the multiply accumulate (MAC) computation on data and the weight. A static random access memory (SRAM) mostly uses the discharge time after a bit line (BL) is charged to determine a value of the multiply accumulate computation. For example, the more the number of opened cells, the faster the discharge speed, while the fewer the number of open cells, the slower the discharge speed. Therefore, after measuring the remaining power of the bit line in a fixed time, the current value of the multiply accumulate computation may be reversely deduced.

However, since the amount of charge that may be stored in the bit line itself is not much, when the number of cells opened at the same time is too large, the leakage speed is too fast, and it is difficult to determine the problem within a fixed time. Therefore, it is usually impossible to open too many data channels to input data at the same time for computations in memory of the static random access memory to perform computation in C memory. As a result, although the operation speed of the static random access memory is extremely fast, the parallelism is difficult to improve, and if the memory cell is to be changed, it may cause problems such as a decrease in the yield rate of the memory.

Another novel technology is to use resistive memory (such as a resistive random-access memory (RRAM)) to perform the multiply accumulate computation of computing in memory, and use the current flowing through the equivalent resistance value of different number of the opened cells as the value of the multiply accumulate computation. This method may increase the number of data channels that may be opened at the same time. However, due to the factor (the R/N ratio) that the equivalent resistance will rapidly decrease after the cells are connected in parallel, when the equivalent resistance is reduced to a certain level, the parasitic resistance on the wiring will become the dominant value, so that if a sufficient number of cells are to be opened, the resistance of the cell must be high enough, usually up to the level of ten k ohms, which is not easy to achieve for the resistive memory such as resistive memory and magnetoresistive random access memory (MRAM). Therefore, the current computing in memory technology in the resistive memory is still at the computation level of dozens of data channels.

SUMMARY

The disclosure provides a configurable computing unit within memory, which may achieve a function of a multiply accumulate computation without changing the memory array.

A configurable computing unit within memory of the disclosure includes a first input transistor, a first weight transistor, a first resistor, a second input transistor, a second weight transistor, and a second resistor. The first input transistor has a first end, a control end coupled to a first input bit line, and a second end. The first weight transistor has a first end coupled to the second end of the first input transistor, a control end receiving a first weight bit, and a second end coupled to a first readout bit line. The first resistor is coupled between the first end of the first input transistor and a common signal line. The second input transistor has a first end, a control end coupled to a second input bit line, and a second end. The second weight transistor has a first end coupled to the second end of the second input transistor, a control end receiving the first weight bit, and a second end coupled to the first readout bit line. The second resistor is coupled between the first end of the second input transistor and the common signal line. A resistance value of the second resistor is different from a resistance value of the first resistor.

A configurable computing unit within memory of the disclosure includes a first weight transistor, at least one first input transistor, and at least one second input transistor. The first weight transistor has a first end coupled to a first readout bit line, a control end receiving a first weight bit, and a second end. The at least one first input transistor has a first end coupled to the second end of the first weight transistor, a control end coupled to a first input bit line, and a second end coupled to a common signal line. The at least one second input transistor has a first end coupled to the second end of the first weight transistor, a control end coupled to a second input bit line, and a second end coupled to the common signal line. A number of the at least one first input transistor is different from a number of the at least one second input transistor.

Based on the above, the configurable computing unit in the embodiments of the disclosure achieves the function of the multiply accumulate computation by cascading the weight transistor, the input transistor, and the resistor, and setting the resistance value of different resistors. In this way, since the configurable computing unit is the additional functional block, the multiply accumulate (MAC) computation of the data bits and the weight bits may be achieved without changing the memory array. In addition, by cascading the weight transistor and different numbers of input transistors, the function of the multiply accumulate computation is achieved.

Several exemplary embodiments accompanied with figures are described in detail below to further describe the disclosure in details.

DETAILED DESCRIPTION OF DISCLOSED EMBODIMENTS

A concept of the disclosure is to convert a conventional memory from digital data to analog data for a CIM computation by adding functional blocks required for computing in memory to the conventional memory, and use resistors with different impedance values to achieve a total current for different computations and reduce process drift. Also, the parallelism of computation may be increased, so that the technology in the disclosure may have the fast operation of the memory itself at the same time, and the high parallel computing power of in-memory computing is extremely suitable for use of deduction of edge computing.

In other words, the concept of the disclosure is to disclose an architecture for computing in memory in artificial intelligence (AI). The architecture may be output by a sense amplifier (SA) of the conventional memory or use a bit line (BL) to extract the stored data to a weight reader block, and combine with an extracted computing cell, through a total current of the computing cell opened by both an input transistor and a weight transistor as a computing value, to achieve a computing function of a multiply accumulate computation for computing in memory. In the concept of the disclosure, only a peripheral circuit of the computing cell in the memory cell is required to be increased without changing the architecture of the memory cell, so as to reduce the risk of read drift.

Figure 1:
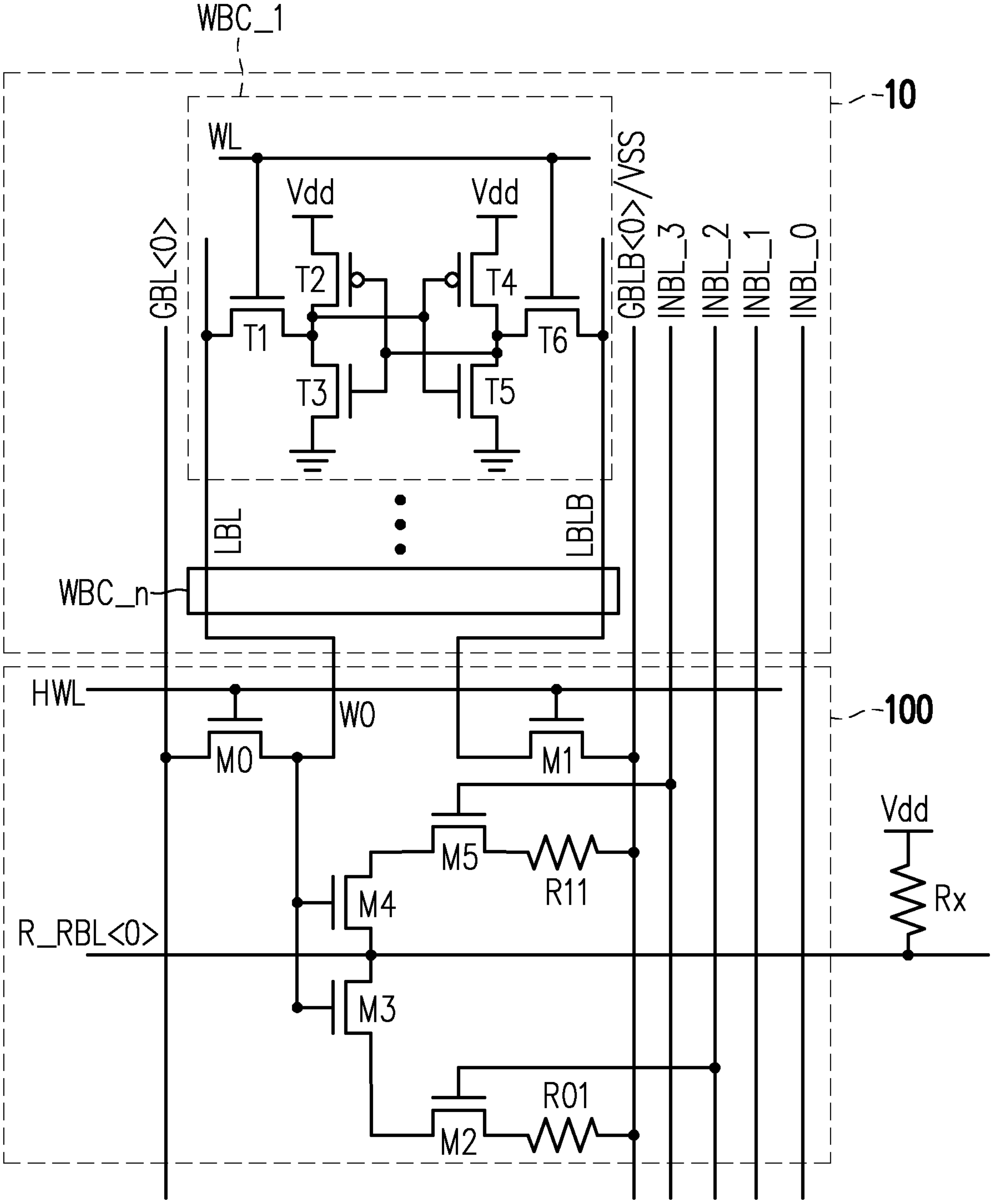
FIG. 1 is a schematic circuit diagram in which a configurable computing unit is coupled to a weight memory cell according to the first embodiment of the disclosure.

FIG. 1 is a schematic circuit diagram in which a configurable computing unit is coupled to a weight memory cell according to the first embodiment of the disclosure. Referring to FIG. 1, in this embodiment, a memory sub-array 10 and a configurable computing unit 100 are disposed in a memory (not shown), and the configurable computing unit 100 at least includes transistors M0 to M5, a resistor R01 (corresponding to a first resistor), and a resistor R11 (corresponding to a second resistor).

The transistor M2 (corresponding to a first input transistor) has a first end, control end coupled to one of multiple input bit lines (such as INBL_0 to INBL_3) (here, the input bit line INBL_2 is taken as an example, which corresponds to a first input bit line), and a second end. The transistor M3 (corresponding to a first weight transistor) has a first end coupled to the second end of the transistor M2, a control end receiving a first weight bit W0 from the memory sub-array 10, and a second end coupled to a first readout bit line R_RBL<0>. The first readout bit line R_RBL<0> is coupled to a high-voltage power cord Vdd through an external resistor Rx. The resistor R01 is coupled between the first end of the transistor M2 and a common signal line. The common signal line may be used as one of a global bit line bar GBLB<0> or a low-voltage power cord VSS according to the operation, which depends on a circuit design.

The transistor M5 (corresponding to a second input transistor) has a first end, a control end coupled to another one of the input bit lines (such as INBL_0 to INBL_3) (here, the input bit line INBL_3 is taken as an example, which corresponds to a second input bit line), and a second end. The transistor M4 (corresponding to a second weight transistor) has a first end coupled to the second end of the transistor M5, a control end receiving the first weight bit W0, and a second end coupled to the first readout bit line R_RBL<0>. The resistor Ru is coupled between the first end of the transistor M5 and the common signal line (as shown by GBLB<0>/VSS).

In this embodiment, a resistance value of the resistor R11 is different from a resistance value of the resistor R01. Therefore, a total current flowing through the first readout bit line R_RBL<0> reflects a sum of a weight product of the first weight bit W0 and a bit transmitted by the input bit line INBL_2 (that is, a logic level) and a weight product of the first weight bit W0 and the bit transmitted by the input bit line INBL_3 (that is, the logic level). According to the above, the configurable computing unit 100 is an additional functional block. Therefore, a multiply accumulate (MAC) computation of 2 data bits and 1 weight bit may be achieved without changing a memory array.

In the embodiment of the disclosure, the resistance value of the resistor R11 may be 2 to the power of n times the resistance value of the resistor R01, where n is a positive integer greater than or equal to 1. For example, the resistance value of the resistor Ru may be twice the resistance value of the resistor R01. However, the embodiment of the disclosure is not limited thereto.

In this embodiment, the transistors M0 and M1 control whether the memory sub-array 10 is written based on a management word line HWL, that is, determine whether the bit transmitted by a global bit line GBL<0> is written into weight memory cells in (such as WBC_1 to WBC_n) in the memory sub-array 10. Furthermore, the transistor M0 has a first end coupled to the global bit line GBL<0>, a control end coupled to the management word line HWL, and a second end coupled to a local bit line LBL of the memory sub-array 10. The transistor M1 has a first end coupled to the common signal line as the global bit line bar GBLB<0>, a control end coupled to the management word line HWL, and a second end coupled to a local bit line bar LBLB of the memory sub-array 10.

In this embodiment, the memory sub-array 10 includes, for example, the weight memory cells WBC_1 to WBC_n.

the weight memory cell is, for example, a static random access memory (SRAM), but the embodiment of the disclosure is not limited thereto. In this embodiment, the weight memory cell (taking WBC_1 as an example) includes, for example, transistors T1 to T6. The transistor T1 has a first end coupled to the local bit line LBL, a control end coupled to a word line WL, and a second end. The transistor T2 has a first end coupled to the high-voltage power cord Vdd, a control end, and a second end coupled to the second end of the transistor T1. The transistor T3 has a first end coupled to the second end of the transistor T1, a control end coupled to the control end of the transistor T2, and a second end coupled to a ground line.

The transistor T4 has a first end coupled to the high voltage power cord Vdd, a control end coupled to the second end of the transistor T1, and a second end coupled to the control end of the transistor T2. The transistor T5 has a first end coupled to the control end of the transistor T2, a control end coupled to the second end of the transistor T1, and a second end coupled to the ground line. The transistor T6 has a first end coupled to the control end of the transistor T2, a control end coupled to the word line WL, and a second end coupled to the local bit line bar LBLB.

Figure 2:
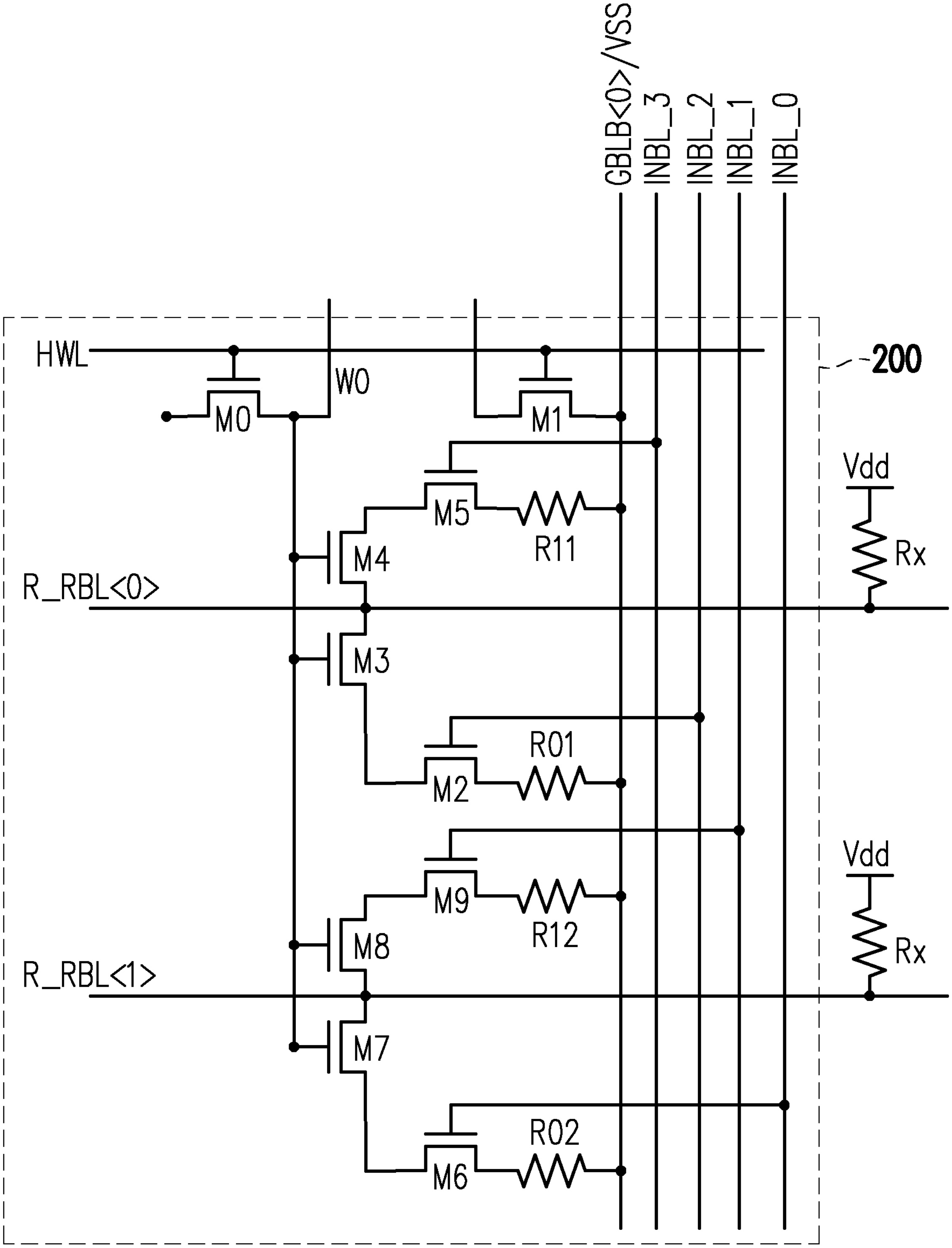
FIG. 2 is a schematic circuit diagram of a configurable computing unit according to the second embodiment of the disclosure.

FIG. 2 is a schematic circuit diagram of a configurable computing unit according to the second embodiment of the disclosure. Referring to FIGS. 1 and 2, the same or similar elements are denoted by the same or similar reference numerals. A configurable computing unit 200 is substantially the same as the configurable computing unit 100. A difference is that the configurable computing unit 200 further includes transistors M6 to M9, a resistor R02 (corresponding to a third resistor), and a resistor R12 (corresponding to a fourth resistor).

The transistor M6 (corresponding to a third input transistor) has a first end, a control end coupled to still another one of the input bit lines (such as INBL_0 to INBL_3) (here, the input bit line INBL_0 is taken as an example, which corresponds to a third input bit line), and a second end. The transistor M7 (corresponding to a third weight transistor) has a first end coupled to the second end of the transistor M6, a control end receiving the first weight bit W0, and a second end coupled to a second readout bit line R_RBL<1>. The resistor R02 is coupled between the first end of the transistor M6 and the common signal line (as shown by GBLB<0>/VSS).

The transistor M9 (corresponding to a fourth input transistor) has a first end, a control end coupled to another one of the input bit lines (such as INBL_0 to INBL_3) (here, the input bit line INBL_1 is taken as an example, which corresponds to a fourth input bit line), and a second end. The transistor M8 (corresponding to a fourth weight transistor) has a first end coupled to the second end of the transistor M9, a control terminal receiving the first weight bit W0, and a second end coupled to the second readout bit line R_RBL<1>. The resistor R12 is coupled between the first end of the transistor M9 and the common signal line (as shown by GBLB<0>/VSS).

A resistance value of the resistor R12 is different from a resistance value of the resistor R02, and the configurable computing unit 200 may achieve the multiply accumulate (MAC) computation of 4 data bits and 1 weight bit. In this embodiment of the disclosure, the resistance value of the resistor R11 is 2 to the power of n times the resistance value of the resistor R01, and the resistance value of the resistor R12 is 2 to the power of n times the resistance value of the resistor R02, where n is a positive integer greater than or equal to 1. The resistance value of the resistor R11 may be the same as the resistance value of the resistor R12, and the resistance value of the resistor R02 may be the same as the resistance value of the resistor R02.

Figure 3:
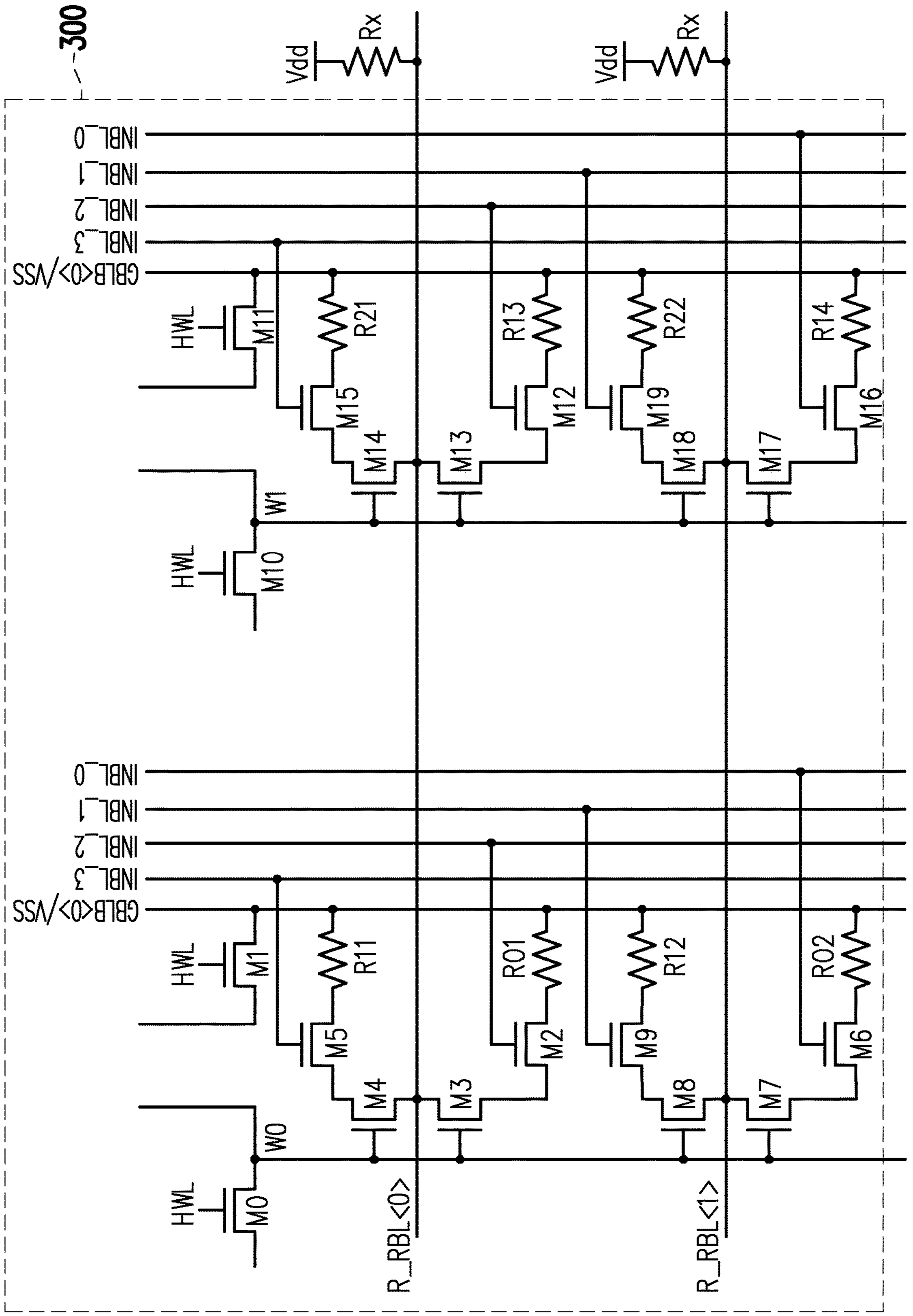
FIG. 3 is a schematic circuit diagram of a configurable computing unit according to the third embodiment of the disclosure.

FIG. 3 is a schematic circuit diagram of a configurable computing unit according to the third embodiment of the disclosure. Referring to FIGS. 2 and 3, the same or similar elements are denoted by the same or similar reference numerals. A configurable computing unit 300 is substantially the same as the configurable computing unit 100. A difference is that the configurable computing unit 300 further includes transistors M10 to M19, a resistor R13 (corresponding to a fifth resistor), a resistor R21 (corresponding to a sixth resistor), a resistor R14 (corresponding to a seventh resistor), and a resistor R22 (corresponding to an eighth resistor). The transistors M10 and M11 may refer to the transistors M0 and M1, and thus details in this regard will not be further reiterated in the following.

The transistor M12 (corresponding to a fifth input transistor) has a first end, a control end coupled to one of the input bit lines (such as INBL_0 to INBL_3) (here, the input bit line INBL_2 is taken as an example, which corresponds to the first input bit line), and a second end. The transistor M13 (corresponding to a fifth weight transistor) has a first end coupled to the second end of the transistor M12, a control end receiving a second weight bit W1 from the memory sub-array 10, and a second end coupled to the first readout bit line R_RBL<0>. The resistor R13 is coupled between the first end of the first input transistor M12 and the common signal line (as shown by GBLB<0>/VSS).

The transistor M15 (corresponding to a sixth input transistor) has a first end, a control end coupled to another one of the input bit lines (such as INBL_0 to INBL_3) (here, the input bit line INBL_3 is taken as an example, which corresponds to the second input bit line), and a second end. The transistor M14 (corresponding to a sixth weight transistor) has a first end coupled to the second end of the transistor M15, a control terminal receiving the second weight bit W1, and a second end coupled to the first readout bit line R_RBL<0>. The resistor R21 is coupled between the first end of the sixth input transistor M15 and the common signal line (as shown by GBLB<0>/VSS). A resistance value of the resistor R21 is different from a resistance value of the resistor R13, but the resistance value of the resistor R13 may be the same as the resistance value of the resistor R11.

The transistor M16 (corresponding to a seventh input transistor) has a first end, a control end coupled to still another one of the input bit lines (such as INBL_0 to INBL_3) (here, the input bit line INBL_0 is taken as an example, which corresponds to the third input bit line), and a second end. The transistor M17 (corresponding to a seventh weight transistor) has a first end coupled to the second end of the transistor M16, a control end receiving the second weight bit W1, and a second end coupled to the second readout bit line R_RBL<1>. The resistor R14 is coupled between the first end of the transistor M16 and the common signal line (as shown by GBLB<0>/VSS).

The transistor M19 (corresponding to an eighth input transistor) has a first end, a control end coupled to another one of the input bit lines (such as INBL_0 to INBL_3) (here, the input bit line INBL_1 is taken as an example, which corresponds to the fourth input bit line), and a second end. The transistor M18 (corresponding to an eighth weight transistor) has a first end coupled to the second end of the transistor M19, a control end receiving the second weight bit W1, and a second end coupled to the second readout bit line R_RBL<1>. The resistor R22 is coupled between the first end of the transistor M19 and the common signal line (as shown by GBLB<0>/VSS). A resistance value of the resistor R22 is different from a resistance value of the resistor R14, but the resistance value of the resistor R14 may be the same as the resistance value of the resistor R12.

According to the above, the configurable computing unit 300 may achieve the multiply accumulate (MAC) computation of 4 data bits and 2 weight bits. That is, each of the first readout bit line R_RBL<0> and the second readout bit line R_RBL<1> is the accumulation of two multiply accumulate computations.

In this embodiment of the disclosure, the resistance value of the resistor R12 is different from the resistance value of the resistor R02. In addition, in this embodiment of the disclosure, the resistance value of the resistor R11 is 2 to the power of n times the resistance value of the resistor R01, and the resistance value of the resistor R12 is 2 to the power of n times the resistance value of the resistor R02, where n is a positive integer greater than or equal to 1. The resistance value of the resistor R11 may be the same as the resistance value of the resistor R12, and the resistance value of the resistor R01 may be the same as the resistance value of the resistor R02.

In this embodiment of the disclosure, the resistance value of the resistor R21 is 2 to the power of n times the resistance value of the resistor R13, and the resistance value of the resistor R22 is 2 to the power of n times the resistance of the resistor R14. In addition, the resistance value of the resistor R13 is 2 to the power of n times the resistance value of the resistor R01; the resistance value of the resistor R21 is 2 to the power of n times the resistance value of the resistor R11; the resistance value of the resistor R14 is 2 to the power of n times the resistance of the resistor R02, and the resistance value of the resistor R22 is 2 to the power of n times the resistance of the resistor R12.

In this embodiment of the disclosure, a ratio of the resistance value of the resistor R11 to the resistance value of the first resistor R01 may be different from a ratio of the resistance value of the resistor R21 to the resistance value of the resistor R13, and a ratio of the resistance value of the resistor R12 to the resistance value of the resistor R02 may be different from a ratio of the resistance value of the resistor R22 to the resistance value of the resistor R14.

Figure 4:
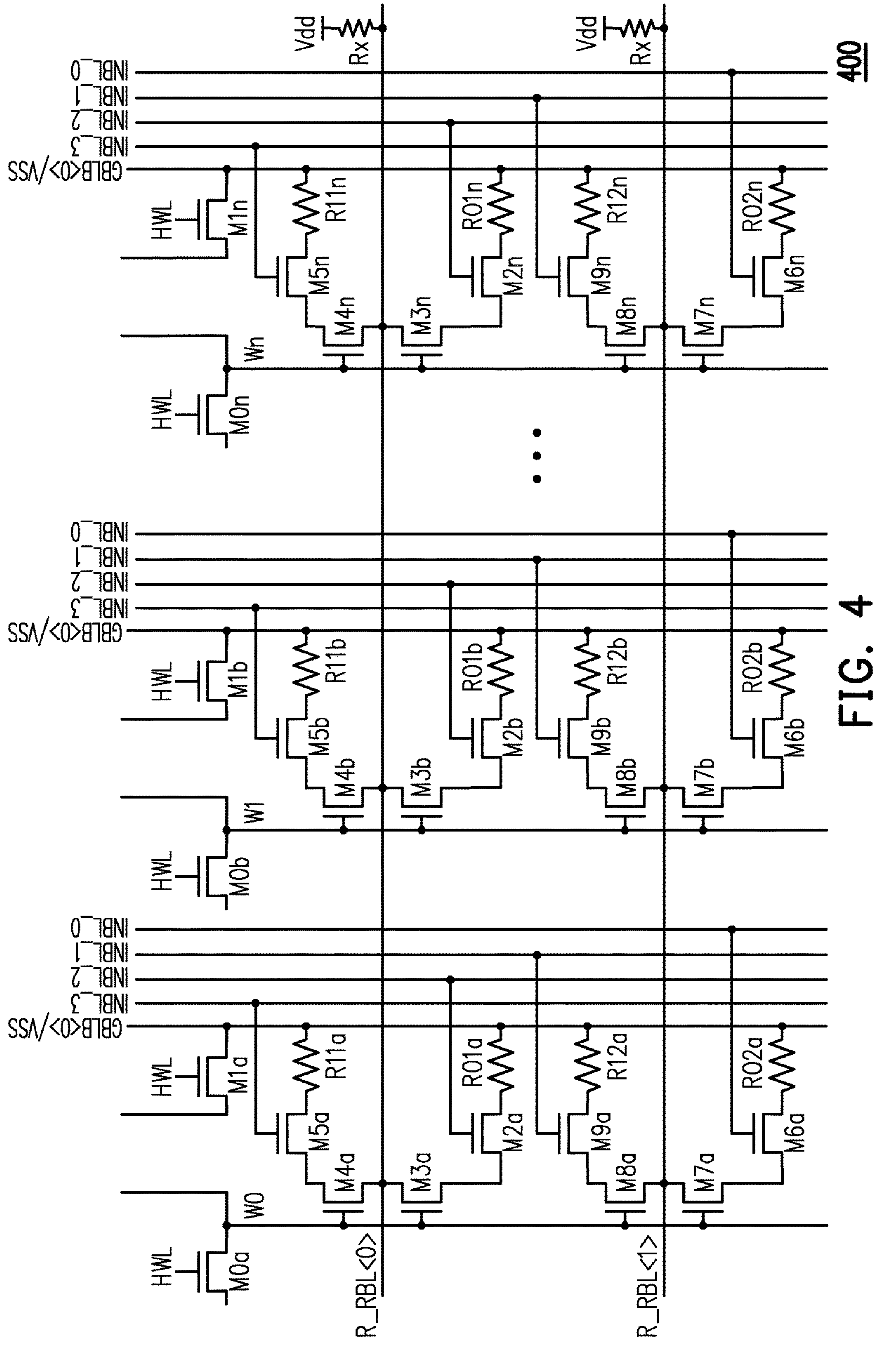
FIG. 4 is a schematic circuit diagram of a configurable computing unit according to the fourth embodiment of the disclosure.

FIG. 4 is a schematic circuit diagram of a configurable computing unit according to the fourth embodiment of the disclosure. Referring to FIGS. 2 and 4, in this embodiment, a configurable computing unit 400 includes at least transistors M0*a* to M0*n*, M1*a* to M1*n*, M2*a* to M2*n*, M3*a* to M3*n*, M4*a* to M4*n*, M5*a* to M5*n*, M6*a* to M6*n*, M7*a* to M7*n*, M8*a* to M8*n*, and M9*a* to M9*n*, and resistors R01*a* to R01*n*, R02*a* to R02*n*, R11*a* to R11*n*, and R12*a* to R12*n*. The configurable computing unit 400 may be regarded as a combination of the configurable computing units 200. That is, a coupling relationship of the transistor M0*a* to M0*n*, M1*a* to M1*n*, M2*a* to M2*n*, M3*a* to M3*n*, M4*a* to M4*n*, M5*a* to M5*n*, M6*a* to M6*n*, M7*a* to M7*n*, M8*a* to M8*n*, and M9*a* to M9*n*, and the resistors R01*a* to R01*n*, R02*a* to R02*n*, R11*a* to R11*n*, and R12*a* to R12*n* may refer to a coupling relationship of the transistors M0 to M9 and the resistors R01, R02, R11, and R12 shown in FIG. 2. Thus, details in this regard will not be further reiterated in the following.

In this embodiment, the configurable computing unit 400 may achieve the multiply accumulate (MAC) computation of 4 data bits and n weight bits (that is, the first weight bit W0 to the $n^{th}$ weight bit Wn). That is, each of the first readout bit line R_RBL<0> and the second readout bit line R_RBL<1> is the accumulation of n multiply accumulate computations. In addition, each row may be a combination of different weights. For example, a resistance value of the resistor R11*a* may be different from a resistance value of the resistor R11*b*, and/or a resistance value of the resistor R01*a* may be different from a resistance value of the resistor R01*b*.

Figure 5:
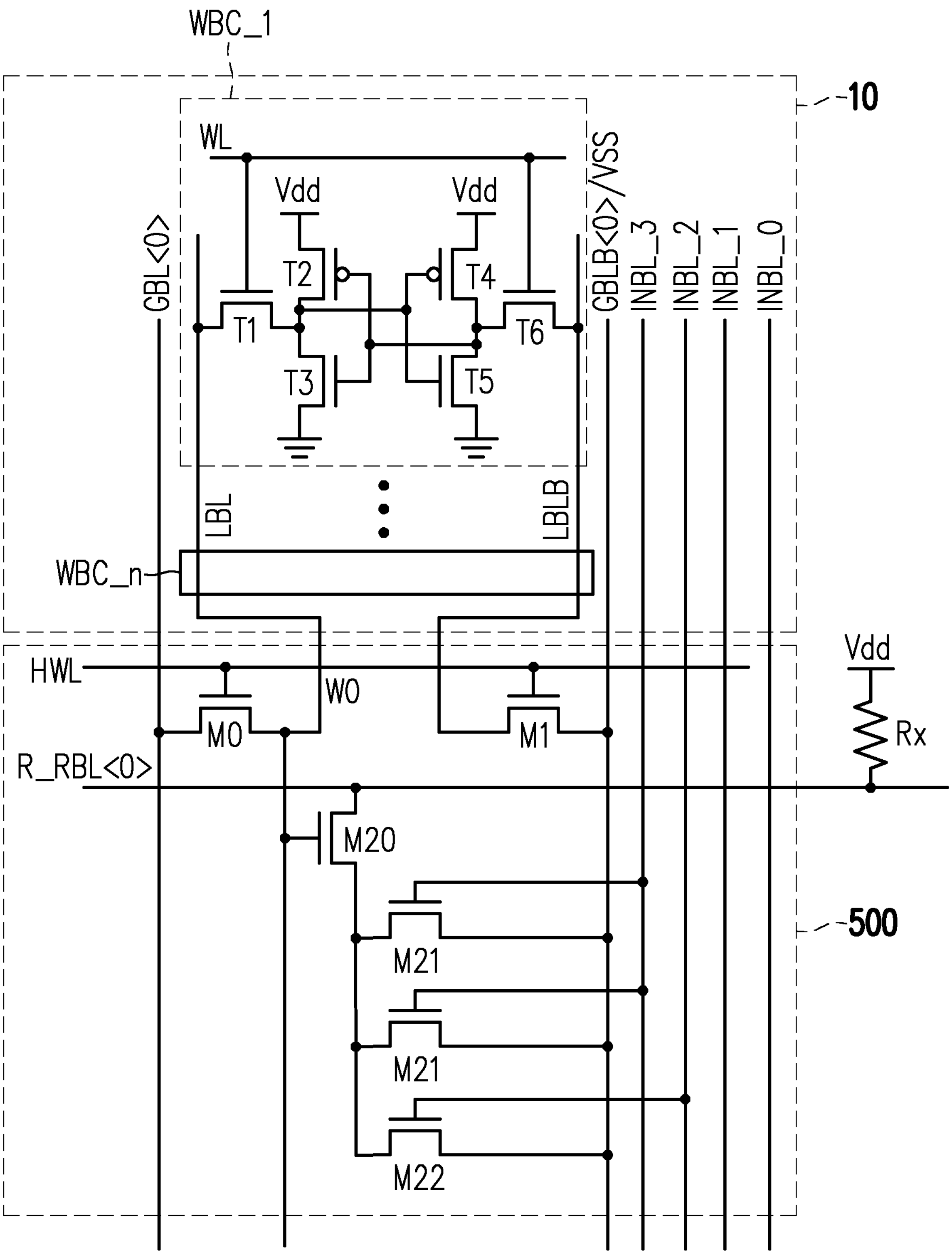
FIG. 5 is a schematic circuit diagram in which a configurable computing unit is coupled to a weight memory cell according to the fifth embodiment of the disclosure.

FIG. 5 is a schematic circuit diagram in which a configurable computing unit is coupled to a weight memory cell according to the fifth embodiment of the disclosure. Referring to FIGS. 1 and 5, the same or similar elements are denoted by the same or similar reference numerals. In this embodiment, a configurable computing unit 500 within memory includes transistors M0, M1, M20, two M21, and M22. A coupling relationship of the transistors M0 and M1 may refer to what is shown in FIG. 1, and thus details in this regard will not be further reiterated in the following.

The transistor M20 (corresponding to the first weight transistor) has a first end coupled to the first readout bit line R_RBL<0>, a control end receiving the first weight bit W0, and a second end. The transistor M22 (corresponding to the first input transistor) has a first end coupled to the second end of the transistor M20, a control end coupled to one of the input bit lines (such as INBL_0 to INBL_3) (here, the input bit line INBL_2 is taken as an example, which corresponds to the first input bit line), and a second end coupled to the common signal line (as shown by GBLB<0>/VSS). Each of the transistors M21 (corresponding to the second input transistor) has a first end coupled to the second end of the transistor M20, a control end coupled to another one of the input bit lines (such as INBL_0 to INBL_3) (here, the input bit line INBL_3 is taken as an example, which corresponds to the second input bit line), and a second end coupled to the common signal line (as shown by GBLB<0>/VSS).

In this embodiment, the number of the transistors M22 is different from the number of the transistors M21. Therefore, the total current flowing through the first readout bit line R_RBL<0> reflects the sum of the weight product of the first weight bit W0 and the bit transmitted by the input bit line INBL_2 (that is, the logic level) and the weight product of the first weight bit W0 and the bit transmitted by the input bit line INBL_3 (that is, the logic level).

In this embodiment, the number of the transistors M22 is one as an example, and the number of the transistors M21 is two as an example. However, in other embodiments, the number of the transistors M22 may be two or other numbers, and the number of the transistors M21 may be four or other numbers. In addition, the number of the transistors M21 may be 2 to the power of n times the number of the transistors M22.

Figure 6:
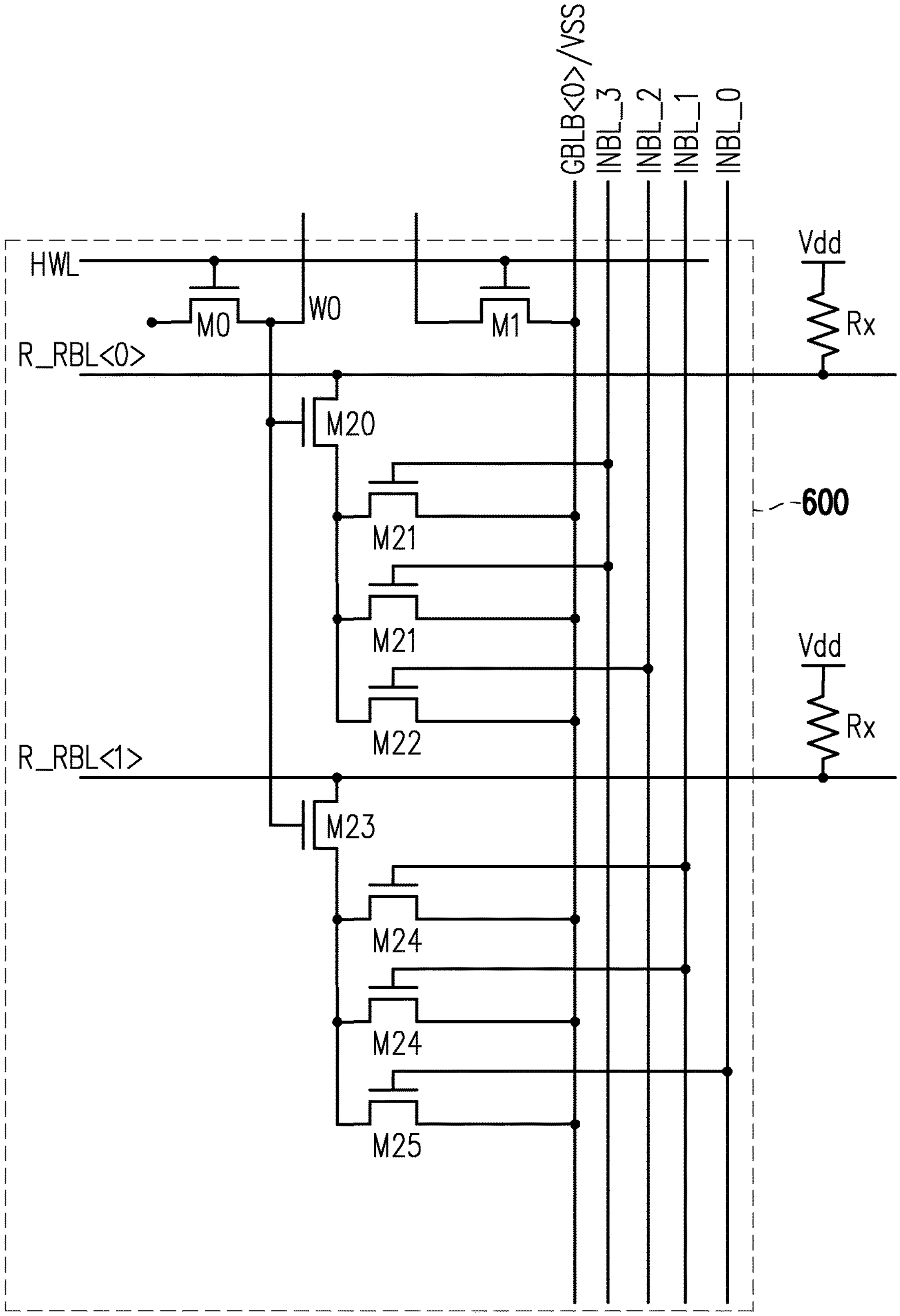
FIG. 6 is a schematic circuit diagram of a configurable computing unit according to the sixth embodiment of the disclosure.

FIG. 6 is a schematic circuit diagram of a configurable computing unit according to the sixth embodiment of the disclosure. Referring to FIGS. 5 and 6, the same or similar elements are denoted by the same or similar reference numerals. A configurable computing unit 600 is substantially the same as the configurable computing unit 500. A difference is that the configurable computing unit 600 further includes transistors M23, two M24, and M25.

The transistor M23 (corresponding to the second weight transistor) has a first end coupled to the second readout bit line R_RBL<1>, a control end receiving the first weight bit W0, and a second end. The transistor M25 (corresponding to the third input transistor) has a first end coupled to the second end of the transistor M23, a control end coupled to still another one of the input bit lines (such as INBL_0 to INBL_3) (here, the input bit line INBL_0 is taken as an example, which corresponds to the third input bit line), and a second end coupled to the common signal line (as shown by GBLB<0>/VSS). The transistor M24 (corresponding to the fourth input transistor) has a first end coupled to the second end of the transistor M23, a control end coupled to another one of the input bit lines (such as INBL_0 to INBL_3) (here, the input bit line INBL_1 is taken as an example, which corresponds to the fourth input bit line), and a second end coupled to the common signal line (as shown by GBLB<0>/VSS).

In this embodiment, the number of the transistors M25 is different from the number of the transistors M24. In addition, the number of the transistors M25 is one as an example, and the number of the transistors M24 is two as an example. However, in other embodiments, the number of the transistors M25 may be two or other numbers, and the number of the transistors M24 may be four or other numbers. In this embodiment of the disclosure, the number of the transistors M24 may be 2 to the power of n times the number of the transistors M25.

Figure 7:
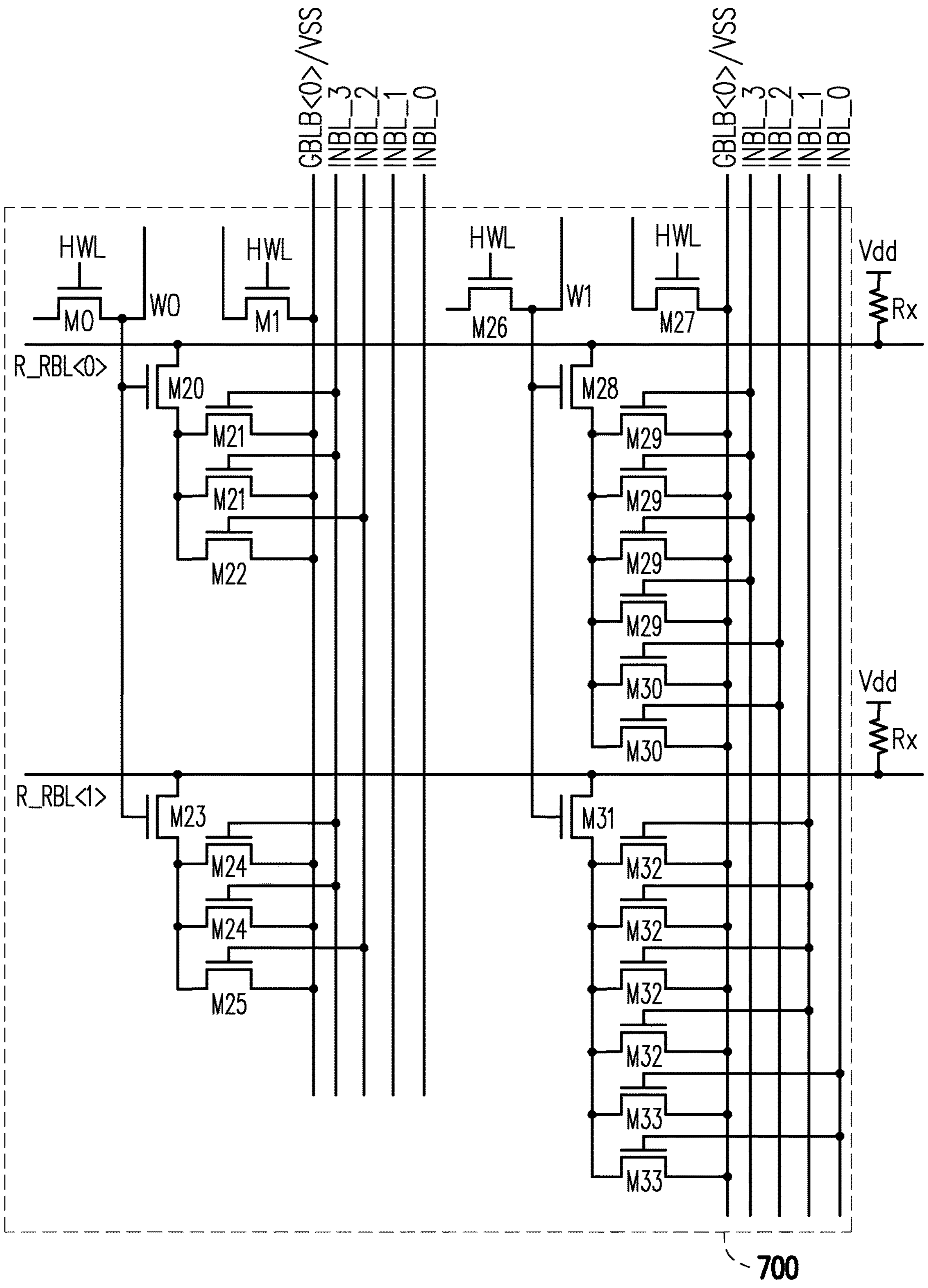
FIG. 7 is a schematic circuit diagram of a configurable computing unit according to the seventh embodiment of the disclosure.

FIG. 7 is a schematic circuit diagram of a configurable computing unit according to the seventh embodiment of the disclosure. Referring to FIGS. 6 and 7, the same or similar elements are denoted by the same or similar reference numerals. A configurable computing unit 700 is substantially the same as the configurable computing unit 600. A difference is that the configurable computing unit 700 further includes transistors M26, M27, M28, four M29, two M30, M31, four M32, two M33.

The transistor M28 (corresponding to the third weight transistor) has a first end coupled to the first readout bit line R_RBL<0>, a control end receiving the second weight bit W1, and a second end. Each of the transistors M30 (corresponding to the fifth input transistor) has a first end coupled to the second end of the transistor M28, a control end coupled to one of the input bit lines (such as INBL_0 to INBL_3) (here, the input bit line INBL_2 is taken as an example, which corresponds to the first input bit line), and a second end coupled to the common signal line (as shown by GBLB<0>/VSS). Each of the transistors M29 (corresponding to the sixth input transistor) has a first end coupled to the second end of the transistor M28, a control end coupled to another one of the input bit lines (such as INBL_0 to INBL_3) (here, the input bit line INBL_3 is taken as an example, which corresponds to the second input bit line), and a second end coupled to the common signal line (as shown by GBLB<0>/VSS).

The transistor M31 (corresponding to the fourth weight transistor) has a first end coupled to the second readout bit line R_RBL<1>, a control end receiving the second weight bit W1, and a second end. Each of the transistors M33 (corresponding to the seventh input transistor) has a first end coupled to the second end of the transistor M31, a control end coupled to still another one of the input bit lines (such as INBL_0 to INBL_3) (here, the input bit line INBL_0 is taken as an example, which corresponds to the third input bit line), and a second end coupled to the common signal line (as shown by GBLB<0>/VSS). The transistor M32 (corresponding to the eighth input transistor) has a first end coupled to the second end of the transistor M31, a control end coupled to another one of the input bit lines (such as INBL_0 to INBL_3) (here, the input bit line INBL_1 is taken as an example, which corresponds to the fourth input bit line), and a second end coupled to the common signal line (as shown by GBLB<0>/VSS).

In this embodiment, the number of the transistors M30 is different from the number of the transistors M29. In addition, the number of the transistors M30 is two as an example, and the number of the transistors M29 is four as an example. However, in other embodiments, the number of the transistors M30 may be four or other numbers, and the number of the transistors M29 may be eight or other numbers. In this embodiment of the disclosure, the number of the transistors M29 may be 2 to the power of n times the number of the transistors M30.

In this embodiment, the number of the transistors M33 is different from the number of the transistors M32. In addition, the number of the transistors M33 is two as an example, and the number of the transistors M32 is four as an example. However, in other embodiments, the number of the transistors M33 may be four or other numbers, and the number of the transistors M32 may be eight or other numbers. In this embodiment of the disclosure, the number of the transistors M32 may be 2 to the power of n times the number of the transistors M33.

In this embodiment of the disclosure, the number of the transistors M30 may be 2 to the power of n times the number of the transistors M22; the number of the transistors M29 may be 2 to the power of n times the number of the transistors M21; the number of the transistors M33 may be 2 to the power of n times the number of the transistors M25, and the number of the transistors M32 may be 2 to the power of n times the number of the transistors M24.

In this embodiment of the disclosure, a ratio of the number of the transistors M21 to the number of the transistors M22 may be different from a ratio of the number of the transistors M29 to the number of the transistors M30, and a ratio of the number of the transistors M24 to the number of the transistors M25 may be different from a ratio of the number of the transistors M32 to the number of the transistor M33.

Figure 8:
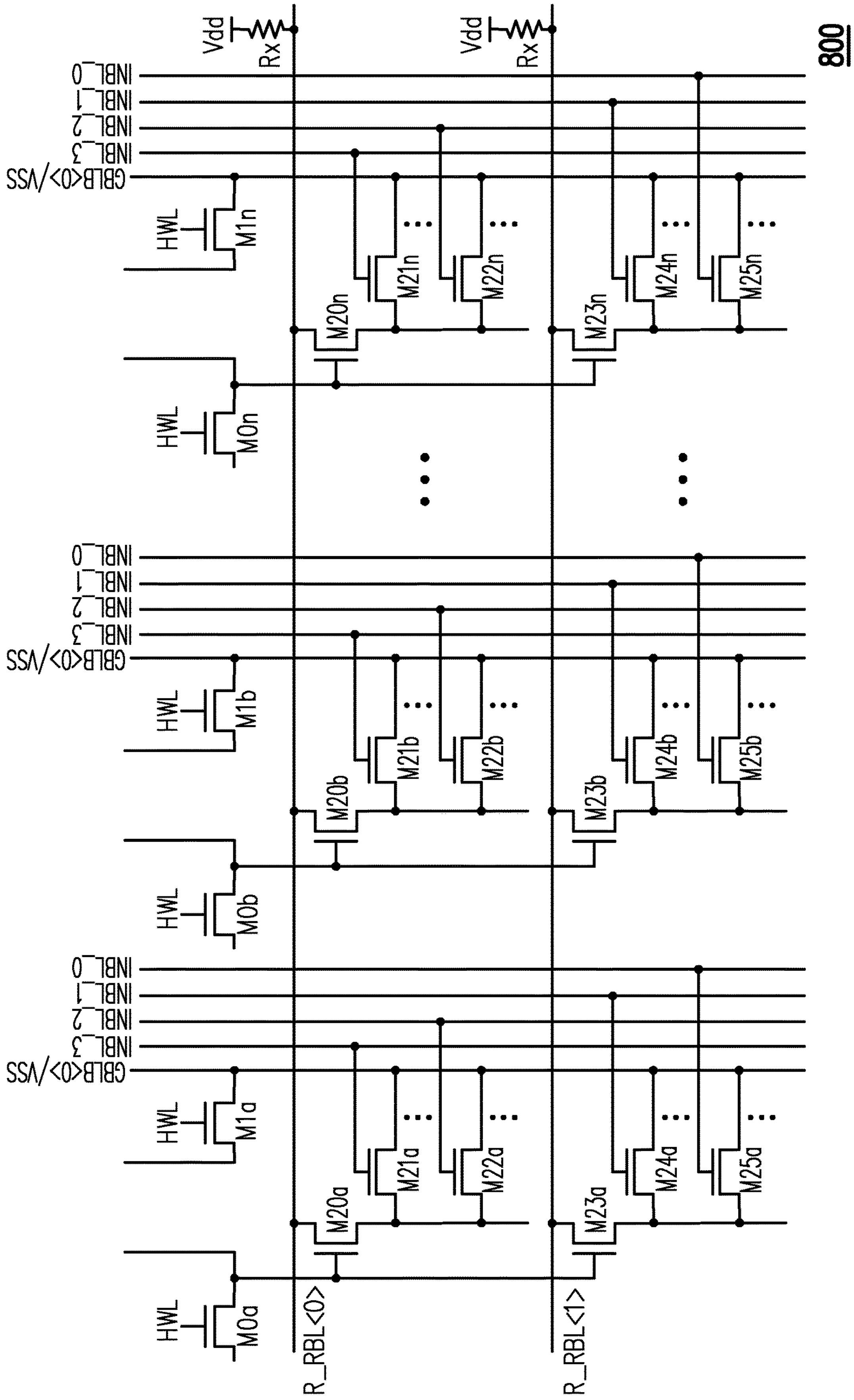
FIG. 8 is a schematic circuit diagram of a configurable computing unit according to the eighth embodiment of the disclosure.

FIG. 8 is a schematic circuit diagram of a configurable computing unit according to the eighth embodiment of the disclosure. Referring to FIGS. 6 and 8, the same or similar elements are denoted by the same or similar reference numerals. In this embodiment, a configurable computing unit 800 includes at least transistors M0*a* to M0*n*, M1*a* to M1*n*, M20*a* to M20*n*, M21*a* to M21*n*, M22*a* to M22*n*, M23*a* to M23*n*, M24*a* to M24*n*, and M25*a* to M25*n*. The configurable computing unit 800 may be regarded as a combination of the configurable computing units 600. That is, a coupling relationship of the transistors M0*a* to M0*n*, M1*a* to M1*n*, M20*a* to M20*n*, M21*a* to M21*n*, M22*a* to M22*n*, M23*a* to M23*n*, M24*a* to M24*n*, and M25*a* to M25*n* may refer to a coupling relationship of the transistors M0, M1, M20, M21, M22, M23, M24, and M25 shown in FIG. 2. Thus, details in this regard will not be further reiterated in the following.

In this embodiment, the configurable computing unit 800 may achieve the multiply accumulate (MAC) computation of 4 data bits and n weight bits. That is, each of the first readout bit line R_RBL<0> and the second readout bit line R_RBL<1> is the accumulation of n multiply accumulate computations. In addition, each row may be a combination of different weights. For example, the number of the transistors M21*a* may be different from the number of the transistors M21*b*, and/or the number of the transistors M22*a* may be different from the number of the transistors M22*b*.

Based on the above, the configurable computing unit in the embodiments of the disclosure achieves the function of the multiply accumulate computation by cascading the weight transistor, the input transistor, and the resistor, and setting the resistance value of different resistors. In this way, since the configurable computing unit is the additional functional block, the multiply accumulate (MAC) computation of the data bits and the weight bits may be achieved without changing the memory array. In addition, by cascading the weight transistor and different numbers of input transistors, the function of the multiply accumulate computation is achieved.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A configurable computing unit within memory, comprising:

a first input transistor having a first end, a control end coupled to a first input bit line, and a second end;

a first weight transistor having a first end coupled to the second end of the first input transistor, a control end receiving a first weight bit, and a second end coupled to a first readout bit line;

a first resistor coupled between the first end of the first input transistor and a common signal line;

a second input transistor having a first end, a control end coupled to a second input bit line, and a second end;

a second weight transistor having a first end coupled to the second end of the second input transistor, a control end receiving the first weight bit, and a second end coupled to the first readout bit line; and a second resistor coupled between the first end of the second input transistor and the common signal line, wherein a resistance value of the second resistor is different from a resistance value of the first resistor, the resistance value of the first resistor determines a weight product of the first weight bit and a bit transmitted by the first input bit line, and the resistance value of the second resistor determines a weight product of the first weight bit and a bit transmitted by the second input bit line.

2. The configurable computing unit according to claim 1, wherein the resistance value of the second resistor is 2 to the power of n times the resistance value of the first resistor, and n is a positive integer greater than or equal to 1.

3. The configurable computing unit according to claim 1, further comprising:

a third input transistor having a first end, a control end coupled to a third input bit line, and a second end;

a third weight transistor having a first end coupled to the second end of the third input transistor, a control end receiving the first weight bit, and a second end coupled to a second readout bit line;

a third resistor coupled between the first end of the third input transistor and the common signal line;

a fourth input transistor having a first end, a control end coupled to a fourth input bit line, and a second end;

a fourth weight transistor having a first end coupled to the second end of the fourth input transistor, a control end receiving the first weight bit, and a second end coupled to the second readout bit line; and a fourth resistor coupled between the first end of the fourth input transistor and the common signal line, wherein a resistance value of the fourth resistor is different from a resistance value of the third resistor.

4. The configurable computing unit according to claim 3, wherein the resistance value of the second resistor is 2 to the power of n times the resistance value of the first resistor, the resistance value of the fourth resistor is 2 to the power of n times the resistance value of the third resistor, and n is a positive integer greater than or equal to 1.

5. The configurable computing unit according to claim 3, further comprising:

a fifth input transistor having a first end, a control end coupled to the first input bit line, and a second end;

a fifth weight transistor having a first end coupled to the second end of the fifth input transistor, a control end receiving a second weight bit, and a second end coupled to the first readout bit line;

a fifth resistor coupled between the first end of the fifth input transistor and the common signal line;

a sixth input transistor having a first end, a control end coupled to the second input bit line, and a second end;

a sixth weight transistor having a first end coupled to the second end of the sixth input transistor, a control end receiving the second weight bit, and a second end coupled to the first readout bit line;

a sixth resistor coupled between the first end of the sixth input transistor and the common signal line;

a seventh input transistor having a first end, a control end coupled to the third input bit line, and a second end;

a seventh weight transistor having a first end coupled to the second end of the seventh input transistor, a control end receiving the second weight bit, and a second end coupled to the second readout bit line;

a seventh resistor coupled between the first end of the seventh input transistor and the common signal line;

an eighth input transistor having a first end, a control end coupled to the fourth input bit line, and a second end;

an eighth weight transistor having a first end coupled to the second end of the eighth input transistor, a control end receiving the second weight bit, and a second end coupled to the second readout bit line; and an eighth resistor coupled between the first end of the eighth input transistor and the common signal line, wherein a resistance value of the sixth resistor is different from a resistance value of the fifth resistor, and a resistance value of the eighth resistor is different from a resistance value of the seventh resistor.

6. The configurable computing unit according to claim 5, wherein the resistance value of the second resistor is 2 to the power of n times the resistance value of the first resistor, the resistance value of the fourth resistor is 2 to the power of n times the resistance value of the third resistor, the resistance value of the sixth resistor is 2 to the power of n times the resistance value of the fifth resistor, the resistance value of the eighth resistor is 2 to the power of n times the resistance value of the seventh resistor, and n is a positive integer greater than or equal to 1.

7. The configurable computing unit according to claim 5, wherein the resistance value of the fifth resistor is 2 to the power of n times the resistance value of the first resistor, the resistance value of the sixth resistor is 2 to the power of n times the resistance value of the second resistor, the resistance value of the seventh resistor is 2 to the power of n times the resistance value of the third resistor, the resistance value of the eighth resistor is 2 to the power of n times the resistance value of the fourth resistor, and n is a positive integer greater than or equal to 1.

8. The configurable computing unit according to claim 5, wherein a ratio of the resistance value of the second resistor to the resistance value of the first resistor is different from a ratio of the resistance value of the sixth resistor to the resistance value of the fifth resistor, and a ratio of the resistance value of the fourth resistor to the resistance value of the third resistor is different from a ratio of the resistance value of the eighth resistor to the resistance value of the seventh resistor.

9. A configurable computing unit within memory, comprising:

a first weight transistor having a first end coupled to a first readout bit line, a control end receiving a first weight bit, and a second end;

a plurality of first input transistors having a first end coupled to the second end of the first weight transistor, a control end coupled to a first input bit line, and a second end coupled to a common signal line; and a plurality of second input transistors having a first end coupled to the second end of the first weight transistor, a control end coupled to a second input bit line, and a second end coupled to the common signal line, wherein a number of the plurality of first input transistors is different from a number of the plurality of second input transistors.

10. The configurable computing unit according to claim 9, wherein the number of the plurality of second input transistors is 2 to the power of n times the number of the plurality of first input transistors, and n is a positive integer greater than or equal to 1.

11. The configurable computing unit according to claim 9, further comprising:

a second weight transistor having a first end coupled to a second readout bit line, a control end receiving the first weight bit, and a second end;

a plurality of third input transistors having a first end coupled to the second end of the second weight transistor, a control end coupled to a third input bit line, and a second end coupled to the common signal line; and a plurality of fourth input transistors having a first end coupled to the second end of the second weight transistor, a control end coupled to a fourth input bit line, and a second end coupled to the common signal line, wherein a number of the plurality of third input transistors is different from a number of the plurality of fourth input transistors.

12. The configurable computing unit according to claim 11, wherein the number of the plurality of second input transistors is 2 to the power of n times the number of the plurality of first input transistors, the number of the plurality of fourth input transistors is 2 to the power of n times the number of the plurality of third input transistors, and n is a positive integer greater than or equal to 1.

13. The configurable computing unit according to claim 11, further comprising:

a third weight transistor having a first end coupled to the first readout bit line, a control end receiving a second weight bit, and a second end;

a plurality of fifth input transistors having a first end coupled to the second end of the third weight transistor, a control end coupled to the first input bit line, and a second end coupled to the common signal line;

a plurality of sixth input transistors having a first end coupled to the second end of the third weight transistor, a control end coupled to the second input bit line, and a second end coupled to the common signal line;

a fourth weight transistor having a first end coupled to the second readout bit line, a control end receiving the second weight bit, and a second end;

a plurality of seventh input transistors having a first end coupled to the second end of the fourth weight transistor, a control end coupled to the third input bit line, and a second end coupled to the common signal line; and a plurality of eighth input transistors having a first end coupled to the second end of the fourth weight transistor, a control end coupled to the fourth input bit line, and a second end coupled to the common signal line, wherein a number of the plurality of fifth input transistors is different from a number of the plurality of sixth input transistors, and a number of the plurality of seventh input transistors is different from a number of the plurality of eighth input transistors.

14. The configurable computing unit according to claim 13, wherein the number of the plurality of second input transistors is 2 to the power of n times the number of the plurality of first input transistors, the number of the plurality of fourth input transistors is 2 to the power of n times the number of the plurality of third input transistors, the number of the plurality of sixth input transistors is 2 to the power of n times the number of the plurality of fifth input transistors, the number of the plurality of eighth input transistors is 2 to the power of n times the number of the plurality of seventh input transistors, and n is a positive integer greater than or equal to 1.

15. The configurable computing unit according to claim 13, wherein the number of the plurality of fifth input transistors is 2 to the power of n times the number of the plurality of first input transistors, the number of the plurality of sixth input transistors is 2 to the power of n times the number of the plurality of second input transistors, the number of the plurality of seventh input transistors is 2 to the power of n times the number of the plurality of third input transistors, the number of the plurality of eighth input transistors is 2 to the power of n times the number of the plurality of fourth input transistors, and n is a positive integer greater than or equal to 1.

16. The configurable computing unit according to claim 13, wherein a ratio of the number of the plurality of second input transistors to the number of the plurality of first input transistors is different from a ratio of the number of the plurality of sixth input transistors to the number of the plurality of fifth input transistors, and a ratio of the number of the plurality of fourth input transistors to the number of the plurality of third input transistors is different from a ratio of the number of the plurality of eighth input transistors to the number of the plurality of seventh input transistors.

* * * * *